(12) United States Patent
Hsu et al.

(10) Patent No.: US 11,482,460 B2
(45) Date of Patent: Oct. 25, 2022

(54) SEMICONDUCTOR PACKAGE STRUCTURES AND METHODS OF MANUFACTURING THE SAME

(71) Applicant: Advanced Semiconductor Engineering, Inc., Kaohsiung (TW)

(72) Inventors: Chia Yun Hsu, Kaohsiung (TW); Ying-Chung Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/703,385

(22) Filed: Dec. 4, 2019

(65) Prior Publication Data
US 2021/0175135 A1 Jun. 10, 2021

(51) Int. Cl.
*H01L 23/04* (2006.01)
*H01L 31/0203* (2014.01)
*H01L 31/02* (2006.01)
*H01L 23/00* (2006.01)
*H01L 23/10* (2006.01)

(52) U.S. Cl.
CPC ............. *H01L 23/04* (2013.01); *H01L 23/10* (2013.01); *H01L 24/45* (2013.01); *H01L 31/0203* (2013.01); *H01L 31/02019* (2013.01); *H01L 24/29* (2013.01); *H01L 2224/48151* (2013.01); *H01L 2924/16195* (2013.01)

(58) Field of Classification Search
CPC ............. H01L 23/04; H01L 31/02019; H01L 31/0203; H01L 24/45; H01L 24/29; H01L 2224/48151; H01L 2924/16152; H01L 2924/16251; H01L 2924/163; H01L 23/051; H01L 23/053; H01L 23/10; H01L 2924/16153
See application file for complete search history.

(56) References Cited

U.S. PATENT DOCUMENTS

| | | | | |
|---|---|---|---|---|
| 6,483,030 B1 * | 11/2002 | Glenn | ..................... | B29C 43/36 174/521 |
| 7,297,918 B1 * | 11/2007 | Chen | ................. | H01L 27/14618 250/208.1 |
| 7,576,401 B1 * | 8/2009 | de Guzman | ......... | G02B 13/001 257/432 |
| 8,896,079 B2 * | 11/2014 | Uekawa | ............ | H01L 27/14625 257/432 |
| 9,025,079 B2 * | 5/2015 | Kamada | ................. | H04N 5/369 348/373 |
| 9,799,802 B2 * | 10/2017 | Kim | ........................ | H01L 33/58 |
| 9,876,949 B2 * | 1/2018 | Wang | ................ | H01L 27/14634 |

(Continued)

FOREIGN PATENT DOCUMENTS

CN 201601132 U * 10/2010
WO WO-2009110339 A1 * 9/2009 ........... B23K 1/0016

*Primary Examiner* — Bitew A Dinke
(74) *Attorney, Agent, or Firm* — Foley & Lardner LLP

(57) ABSTRACT

A semiconductor package structure includes a carrier, an electronic device, a spacer, a transparent panel, and a conductive wire. The electronic device has a first surface and an optical structure on the first surface. The spacer is disposed on the first surface to enclose the optical structure of the electronic device. The transparent panel is disposed on the spacer. The conductive wire electrically connects the electronic device to the carrier and is exposed to air.

13 Claims, 14 Drawing Sheets

(56) References Cited

U.S. PATENT DOCUMENTS

| | | | | |
|---|---|---|---|---|
| 10,129,452 B2* | 11/2018 | Wang | | H01L 27/14625 |
| 2004/0080037 A1* | 4/2004 | Foong | | H01L 27/14634 |
| | | | | 257/687 |
| 2005/0263312 A1* | 12/2005 | Bolken | | H01L 23/49861 |
| | | | | 174/559 |
| 2006/0201708 A1* | 9/2006 | Hsu | | H01L 31/0203 |
| | | | | 174/520 |
| 2009/0267170 A1* | 10/2009 | Chien | | H01L 27/14618 |
| | | | | 257/434 |
| 2010/0149410 A1* | 6/2010 | Matsuzawa | | H01L 23/10 |
| | | | | 348/374 |
| 2010/0164081 A1* | 7/2010 | Haskett | | B81B 7/0067 |
| | | | | 257/680 |
| 2011/0058077 A1* | 3/2011 | Ono | | H01L 27/14618 |
| | | | | 348/294 |
| 2011/0291215 A1* | 12/2011 | Tu | | H01L 27/14685 |
| | | | | 257/433 |
| 2012/0249822 A1* | 10/2012 | Yoshida | | H01L 27/14683 |
| | | | | 348/222.1 |
| 2012/0313203 A1* | 12/2012 | Fuse | | H01L 27/14618 |
| | | | | 257/432 |
| 2013/0052333 A1* | 2/2013 | Lindow | | C23C 16/46 |
| | | | | 427/8 |
| 2013/0264703 A1* | 10/2013 | Tae | | H01L 23/48 |
| | | | | 257/737 |
| 2015/0138424 A1* | 5/2015 | Dobashi | | H04N 5/2254 |
| | | | | 348/340 |
| 2015/0172519 A1* | 6/2015 | Mitarai | | H04N 5/2254 |
| | | | | 348/373 |
| 2015/0325611 A1* | 11/2015 | Jun | | H01L 24/97 |
| | | | | 257/434 |
| 2016/0260761 A1* | 9/2016 | Jun | | H01L 27/14636 |
| 2017/0154913 A1* | 6/2017 | Jun | | H01L 24/97 |
| 2017/0180613 A1* | 6/2017 | Dobashi | | G02B 5/208 |
| 2018/0019274 A1* | 1/2018 | Yang | | H01L 27/14618 |
| 2018/0072563 A1* | 3/2018 | Huang | | H01L 31/0203 |
| 2018/0190553 A1* | 7/2018 | Lin | | H01L 24/48 |
| 2020/0051954 A1* | 2/2020 | Kim | | H01L 27/14636 |
| 2020/0279880 A1* | 9/2020 | Zhang | | H01L 27/14618 |
| 2020/0312897 A1* | 10/2020 | Hsieh | | H01L 27/14618 |
| 2020/0312898 A1* | 10/2020 | Hung | | H01L 27/14636 |
| 2020/0357934 A1* | 11/2020 | Lee | | H01L 31/02325 |

* cited by examiner

SEMICONDUCTOR PACKAGE STRUCTURES AND METHODS OF MANUFACTURING THE SAME

BACKGROUND

1. Technical Field

The present disclosure relates to semiconductor package structures.

2. Description of the Related Art

A semiconductor package structure can include a semiconductor device disposed on a carrier. The semiconductor device can detect an environmental condition (e.g. light).

However, dust(s), particle(s) or the like may adversely affect performance of the semiconductor package structure.

SUMMARY

In some embodiments, the present disclosure provides a semiconductor package structure, which includes a carrier, an electronic device, a spacer, a transparent panel, and a conductive wire. The electronic device has a first surface and an optical structure on the first surface. The spacer is disposed on the first surface to enclose the optical structure of the electronic device. The transparent panel is disposed on the spacer. The conductive wire electrically connects the electronic device to the carrier and is exposed to air.

In some embodiments, the present disclosure provides a semiconductor package structure, which includes an electronic device, a lid, a transparent panel, and a first adhesive layer. The lid surrounds the electronic device. The transparent panel is disposed on the lid. The first adhesive layer is disposed in direct contact with the lid and the electronic device. The electronic device, the lid, the transparent panel and the first adhesive layer seal a space.

In some embodiments, the present disclosure provides a semiconductor package structure, which includes a carrier, an electronic device, a spacer, a transparent panel, and a conductive wire. The electronic device is disposed on the carrier. The spacer is disposed on the electronic device. The transparent panel is disposed on the spacer to define an air space with the electronic device and the spacer. The conductive wire electrically connects the electronic device to the carrier, and is devoid of stress.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
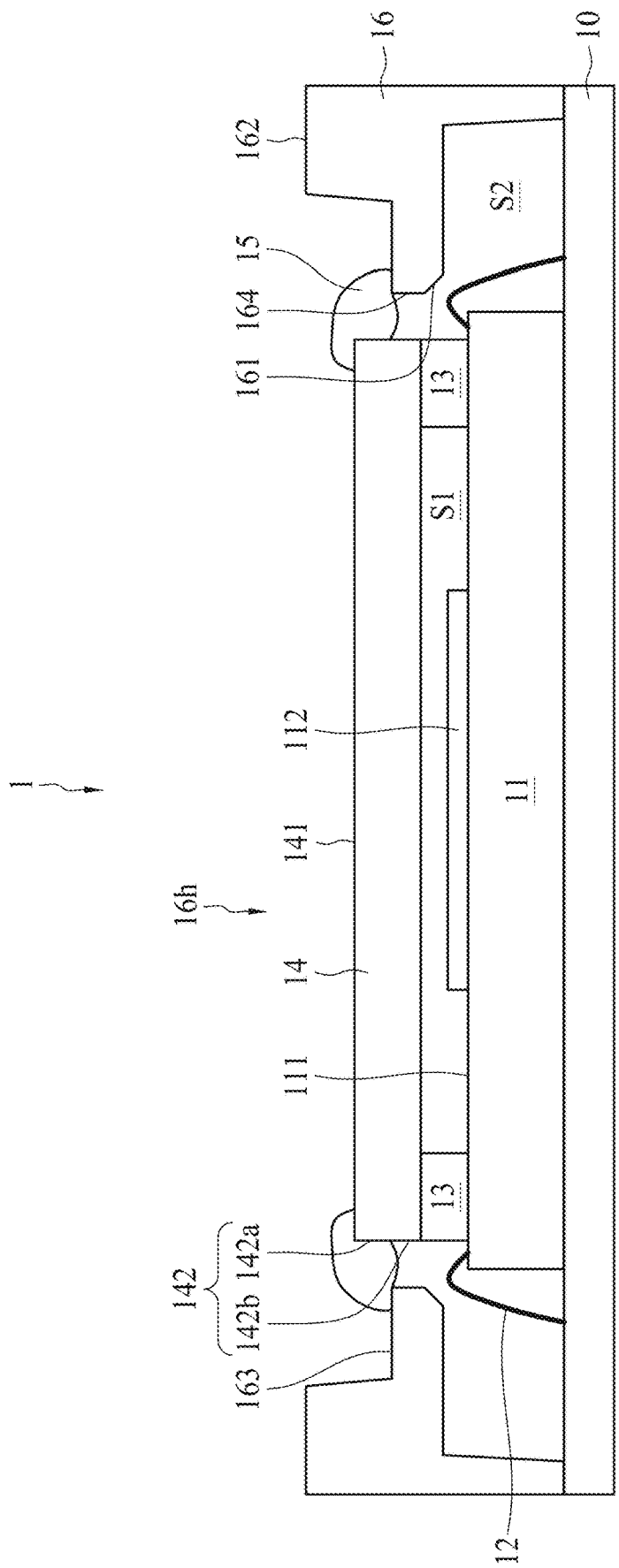
FIG. 1 illustrates a cross-sectional view of a semiconductor package structure in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 illustrates a cross-sectional view of a semiconductor package structure 1 in accordance with some embodiments of the present disclosure.

Referring to FIG. 1, the semiconductor package structure 1 can include a carrier 10, an electronic device 11 (or semiconductor device 11), conductive wires 12, a spacer 13, a transparent panel 14, an adhesive layer 15, and a lid 16.

The carrier 10 can include, for example but is not limited to, a lead frame, a substrate, an interposer, or the like. The carrier 10 can have a redistribution layer (RDL) structure, which may include passivation layer and patterned conductive layer. The carrier 10 can have circuitry, which can include conductive trace(s), via(s), pad(s), etc. (not illustrated in FIG. 1). The carrier 10 can have a single-layer structure. The carrier 10 can have a multi-layer structure.

The electronic device 11 can include a semiconductor die or semiconductor chip. The electronic device 11 can include, for example but is not limited to, a Micro Electro Mechanical System (MEMS) die or chip. The electronic device 11 can include a sensor die which can be sensitive to light. For example, the electronic device 11 can include an optical sensor or detector die (e.g. a complementary metal-oxide-semiconductor (CMOS) image sensor die.

Although the electronic device 11 shown in FIG. 1 has a wire-bond type structure, however, it is contemplated that the semiconductor package structure 1 can include a flip-chip type structure in some other embodiments of the present disclosure. The electronic device 11 has a surface 111. The electronic device 11 can have a circuit (not denoted in FIG. 1) on the surface 111. The electronic device 11 can have an optical structure 112 adjacent to the surface 113. The optical structure 112 can include, for example but is not limited to, some lenses, a micro-lens array, or other optical component(s). The optical structure 112 can be susceptible to particle(s).

The electronic device 11 is disposed on the carrier 10. The electronic device 11 can be attached to the carrier 10 by an adhesive layer (not illustrated in FIG. 1), which may include, for example but is not limited to, glue, gel, film or other types of adhesive. The electronic device 11 can be electrically connected to the carrier 10 by conductive wires 12.

The conductive wire 12 can electrically connect the electronic device 11 to the carrier 10. The conductive wire 12 can be exposed to air. The entire conductive wire 12 can be exposed to air. The conductive wire 12 can be devoid of stress. The conductive wire 12 can be devoid of stress from an environmental change. The conductive wire 12 can be devoid of stress from temperature change. The conductive wire 12 can be devoid of stress from humidity change. The conductive wire can have a terminal (not denoted in FIG. 1) in direct conduct with the electronic device 11, another terminal (not denoted in FIG. 1) in direct conduct with the carrier 10, and a body (not denoted in FIG. 1) between the two terminals, and wherein the body of the conductive wire 12 is spaced apart from the electronic device 11 only by air. The entire body of the conductive wire 12 can be exposed to air.

The conductive wire 12 can undergo relatively extreme environmental change, such as temperature change or humidity change because the conductive wire 12 is free from stress caused by such change(s).

Although the entire conductive wire 12 is exposed to the air as illustrated in FIG. 1, however, it is contemplated that part of the conductive wire 12 can be encapsulated by an encapsulant while another part of the conductive wire 12 can be exposed to air in some other embodiments of the present disclosure.

The spacer 13 can include, for example but is not limited to, adhesive material, epoxy-based material, polymeric material, metal, alloy, oxide, or other suitable material(s). The spacer 13 can have a circular shape from a top view perspective. The spacer 13 can have a circular-like shape from a top view perspective. The spacer 13 can have a rectangular shape from a top view perspective. The spacer 13 can have a rectangular-like shape from a top view perspective. The shape of the spacer 13, from a top view perspective, can be varied of design interest. The spacer 13 can have a ring structure from a top view perspective. The spacer 13 can have a ring-like structure from a top view perspective.

The spacer 13 is disposed on the surface 111 of the electronic device 11. The spacer 13 can surround the optical structure 112 of the electronic device 11. The spacer 13 can enclose the optical structure 112 of the electronic device 11. The spacer 13 can be in direct contact with the electronic device 11. The spacer 13 can be in direct contact with the surface 111 of the electronic device 11. The spacer 13 can be in direct contact with the transparent panel 14. The spacer 13 can be spaced apart from the optical structure 112.

The transparent panel 14 can be hermetically sealed to the electronic device 11 by the spacer 13. The transparent panel 14 can be hermetically sealed to the surface 111 of the electronic device 11 by the spacer 13.

The spacer 13 can have a single layer structure, for example but is not limited to, an adhesive layer, an adhesive film.

Figure 1A:
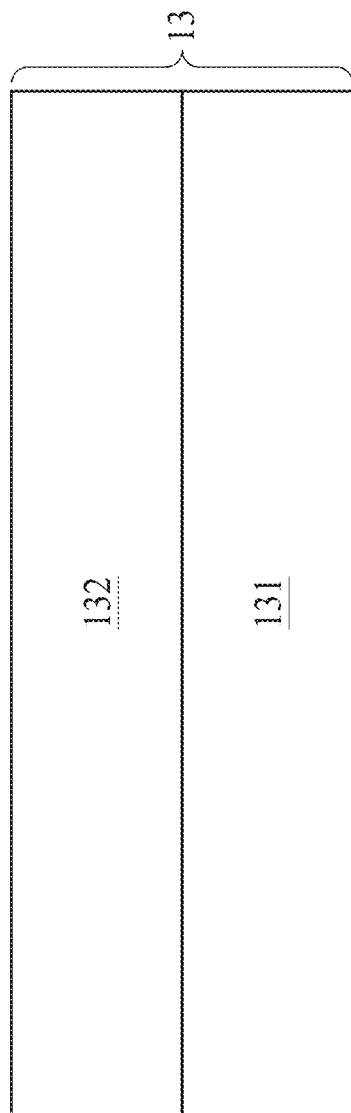
FIG. 1A illustrates an enlarged view of the spacer 13 as shown in FIG. 1 in accordance with some other embodiments of the present disclosure.

The spacer 13 can have a multi-layer structure, for example, referring to FIG. 1A, which illustrates an enlarged view of the spacer 13 as shown in FIG. 1 in accordance with some other embodiments of the present disclosure. The spacer 13 can include a lower layer 131 and an upper layer 132. The layer 131 can include, for example but is not limited to, polymer, metal, alloy, oxide, or other suitable material(s). The layer 132 can include material(s) similar to the layer 131. The layer 132 can include material(s) having relatively great bonding force with the layer 131. For example, the layer 131, which can include copper (Cu), can be formed on the surface 111 of the electronic device 11, and the layer 132, which can include Cu, can be formed on the transparent panel 14. The layer 131 and the layer 132 can be bonded together by heat and press.

Figure 1B:
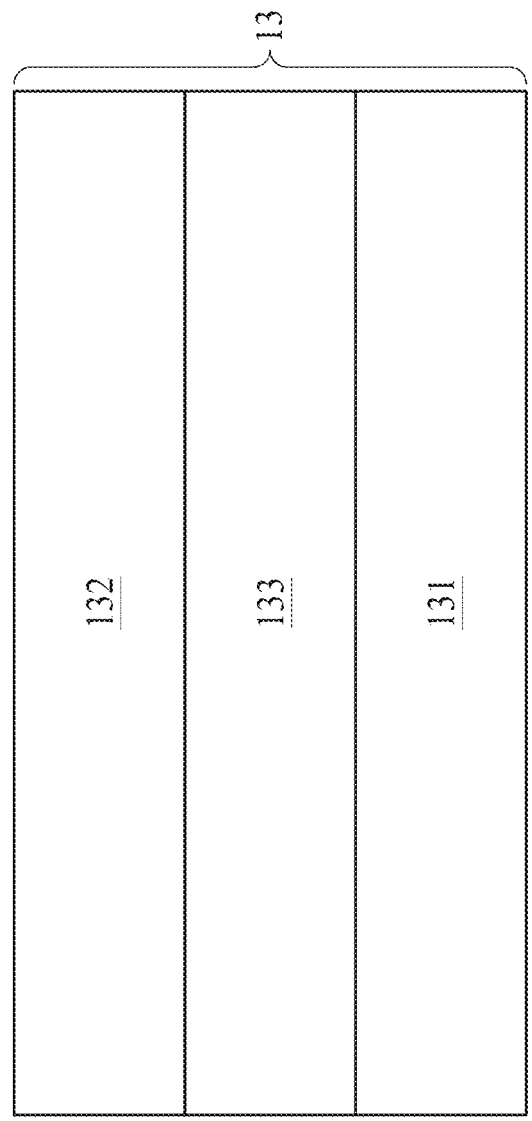
FIG. 1B illustrates another enlarged view of the spacer 13 as shown in FIG. 1 in accordance with some other embodiments of the present disclosure.

FIG. 1B illustrates another enlarged view of the spacer 13 as shown in FIG. 1 in accordance with some other embodiments of the present disclosure. Referring to FIG. 1B, a layer 133 can be disposed between the layer 131 and the layer 132. The layer 133 can include bonding material, for example but is not limited to, solder material, adhesive, or other suitable material(s).

Referring back to FIG. 1A, the transparent panel 14 is disposed on the spacer 13. The transparent panel 14 can include, for example but is not limited to, glass, plastic, or other suitable material(s). The transparent panel 14 can include material(s) to allow light to pass through. The transparent panel 14 can include material(s) to allow light having wavelength in a certain range to pass through. The transparent panel 14 can include filter material(s). The transparent panel 14 can protect the optical structure 112 from damage.

The transparent panel 14 can have a surface 141. The transparent panel 14 can have another surface 142 (e.g. a side surface or a lateral surface 142) adjacent to the surface 141. The surface 142 can have a portion 142a and another portion 142b adjacent to the portion 142a. The transparent panel 14 can be exposed to air. The surface 142 of transparent panel 14 can be exposed to air. The portion 142b of the surface 142 of transparent panel 14 can be exposed to air. The transparent panel 14 can have a width substantially same to the spacer 13.

The lid 16 can be disposed on the carrier 10. The lid 16 can be attached to the carrier 10 by an adhesive layer (not illustrated in FIG. 1).

The lid 16 can include, for example but is not limited to, polymer, plastic, or other suitable material(s). The lid 16 can include opaque material. The lid 16 can include light-absorption material.

The lid 16 can surround the electronic device 11. The lid 16 can enclose the electronic device 11. The lid 16 can surround the conductive wires 12. The lid 16 can enclose the conductive wires 12. The lid 16 can surround the spacer 13. The lid 16 can enclose the spacer 13. The lid 16 can surround the transparent panel 14. The lid 16 can enclose the transparent panel 14. The lid 16 can surround the adhesive layer 15. The lid 16 can enclose the adhesive layer 15.

The lid 16 can define an opening 16h on the transparent panel 14. The lid 16 can define an opening 16h to expose the transparent panel 14. The lid 16a can define an opening 16ah having a relatively great width than the transparent panel 14.

The lid 16 can protect the conductive wires 12 from damage. The lid 16 can include a chamfer 161. The chamfer 161 can be disposed adjacent to the conductive wire 12. Design of the chamfer 161 can prevent the lid 16 from touching or damaging the conductive wire 12 during assembling.

The lid 16 can include a surface 162. The surface 162 can be elevationally different from the transparent panel 14. The surface 162 can be elevationally greater than the transparent panel 14. The lid 16 can include an upper surface 162 and a lower surface 163. The lid 16 can include a step (not denoted in FIG. 1) from a cross-sectional view perspective. The lid 16 can include a surface 164. The surface 164 can be disposed adjacent to the surface 163. The surface 164 can be disposed adjacent to the chamfer 161. The surface 164 can be disposed between the surface 163 and the chamfer 161. The surface 164 can include a side surface or a lateral surface.

The adhesive layer 15 can be disposed on the surface 163 of the lid 16. The adhesive layer 15 can be in direct contact with the surface 163 of the lid 16. The adhesive layer 15 can cover the surface 163 of the lid 16.

The adhesive layer 15 can be disposed on the surface 141 of the transparent panel 14. The adhesive layer 15 can be in direct contact with the transparent panel 14. The adhesive layer 15 can be in direct contact with the surface 141 of the transparent panel 14. The adhesive layer 15 can cover the transparent panel 14. The adhesive layer 15 can cover the surface 141 of the transparent panel 14.

The adhesive layer 15 can be disposed on the surface 142 of the transparent panel 14. The adhesive layer 15 can be in direct contact with the surface 142 of the transparent panel 14. The adhesive layer 15 can be in direct contact with the portion 142a of the surface 142 of the transparent panel 14. The adhesive layer 15 can cover the portion 142a of the surface 142 of transparent panel 14.

The adhesive layer 15 can be in direct contact with the surface 164 of the lid 16.

The adhesive layer 15 can include, for example but is not limited to, glue, gel, film or other types of adhesive. The adhesive layer 15 can include opaque material(s). The adhesive layer 15 can include light-absorption material(s).

Figure 1C:
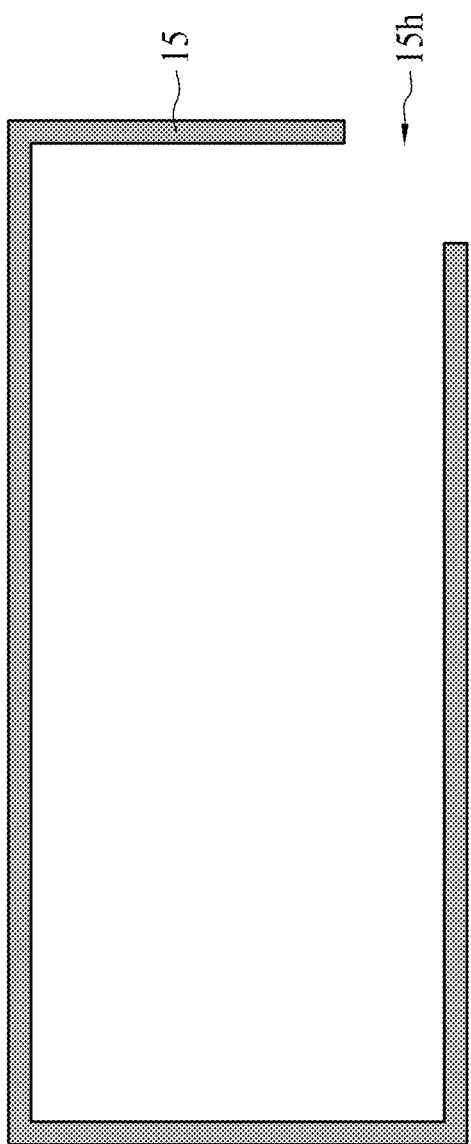
FIG. 1C illustrates a top view of the adhesive layer 15 as shown in FIG. 1 in accordance with some embodiments of the present disclosure.

Referring to FIG. 1C, which illustrates a top view of the adhesive layer 15 as shown in FIG. 1 in accordance with some embodiments of the present disclosure. The adhesive layer 15 can define an opening 15h. Although the opening 15h is formed around the corner of the adhesive layer 15 in FIG. 1C, however, it is contemplated that position of the opening 15h can be varied in some other embodiments of the present disclosure. Although the adhesive layer 15 defines only one opening 15h in FIG. 1C, however, it is contemplated that more opening(s) other than opening 15h can be defined in some other embodiments of the present disclosure. Size of the opening 15h can be changed of interest.

Referring back to FIG. 1, the semiconductor package structure 1 defines a room or space S1. The space S1 can be defined or enclosed by the electronic device 11, the transparent panel 14 and the spacer 13. The semiconductor package structure 1 defines another room or space S2.

When manufacturing a final product that includes the semiconductor package structure 1, various techniques can involve, for example but is not limited to, cutting technique, cleaning technique (e.g. by air gun), heating technique, etc. The particle(s) resulted from the cutting operation can be pushed to pass the opening 15h (as shown in FIG. 1C) to enter the space S2. However, the particle(s) cannot enter the hermetically sealed space S1. Accordingly, the optical structure 112 in the sealed space S1 is protected. In other words, performance of the semiconductor package structure 1 is not affected even the external particle(s) is forced into the space S2.

Moreover, the air in space S1, which can have a relatively less volume, does not have sufficient force or power to break the sealed structure, even the air expands during the heat operation. For example, the relatively less air in the space S1 may still have not enough pressure to break the bond between the transparent panel 14 and the spacer 13, or to break the bond between the electronic device 11 and the spacer 13. In other words, the sealed structure can mitigate popcorn effect.

The opening 15h of the adhesive layer 15 can give vent to the air in the space S2 even during the heat operation. Accordingly, the bond between the lid 16 and the carrier 10 can sustain during the heat operation. In other words, the opening 15h of the adhesive layer 15 can mitigate popcorn effect.

The semiconductor package structure 1 can be integrated into, for example but is not limited to, a lidar system for vehicles, which may undergo extreme condition or environment (e.g. temperature up to 60° Celsius (° C.) or down to −20° C.).

A method of manufacturing the semiconductor package structure 1 in accordance with some embodiments of the present disclosure can include disposing the electronic device 11 on the carrier 10; forming the spacer 13 on the electronic device 11; bonding the conductive wires 12 to the carrier 10 and the electronic device 11; attaching the transparent panel 14 to the spacer 13; attaching the lid 16 to the carrier 10, and forming the adhesive layer 15.

Figure 2:
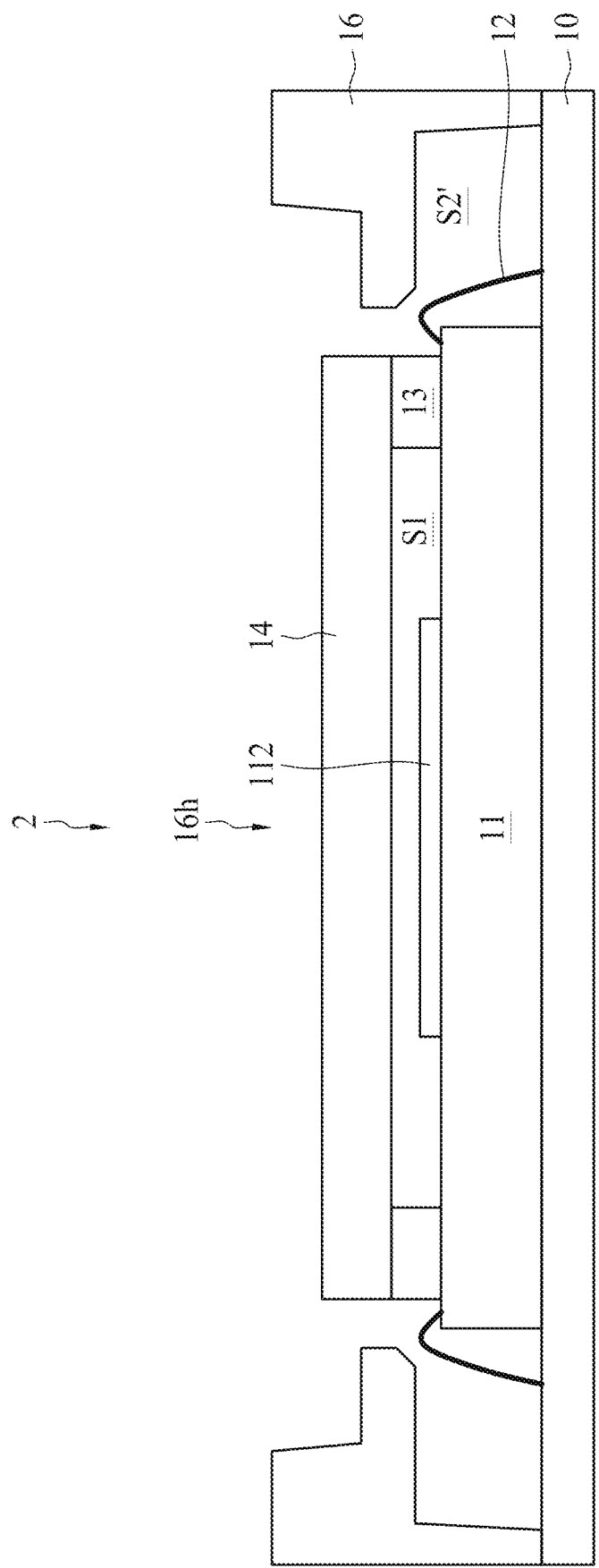
FIG. 2 illustrates a cross-sectional view of a semiconductor package structure in accordance with some other embodiments of the present disclosure.

FIG. 2 illustrates a cross-sectional view of a semiconductor package structure in accordance with some other embodiments of the present disclosure.

Referring to FIG. 2, the semiconductor package structure 2 is similar to the semiconductor package structure 1 as illustrated and described with reference to FIG. 1, except that the adhesive layer 15 is eliminated.

Figure 3:
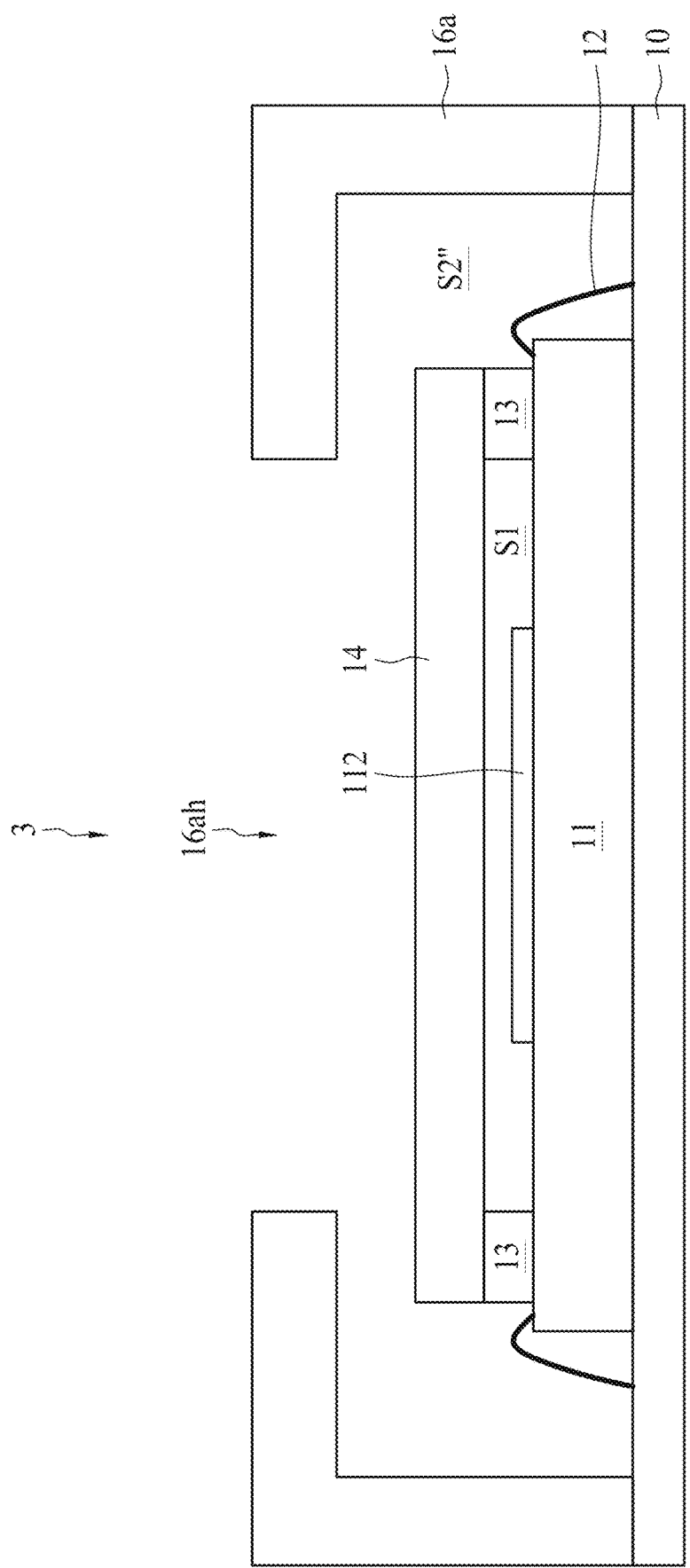
FIG. 3 illustrates a cross-sectional view of a semiconductor package structure in accordance with some other embodiments of the present disclosure.

FIG. 3 illustrates a cross-sectional view of a semiconductor package structure in accordance with some other embodiments of the present disclosure.

Referring to FIG. 3, the semiconductor package structure 3 is similar to the semiconductor package structure 2 as illustrated and described with reference to FIG. 2, except that the lid 16 of the semiconductor package structure 2 is replaced by the lid 16a to form semiconductor package structure 3.

The lid 16a can define an opening 16ah having a relatively less width than the opening 16h as shown in FIG. 1 or FIG. 2. The lid 16a can define an opening 16ah having a relatively less width than the transparent panel 14.

The lid 16a can cover a portion of the transparent panel 14. The lid 16a can cover the periphery of the transparent panel 14. The lid 16a can surround the electronic device 11. The lid 16a can enclose the electronic device 11. The lid 16a can surround the conductive wires 12. The lid 16a can enclose the conductive wires 12. The lid 16a can surround the spacer 13. The lid 16a can enclose the spacer 13. The lid 16a can surround the transparent panel 14. The lid 16a can enclose the transparent panel 14. The lid 16a can surround the adhesive layer 15. The lid 16a can enclose the adhesive layer 15.

Figure 4:
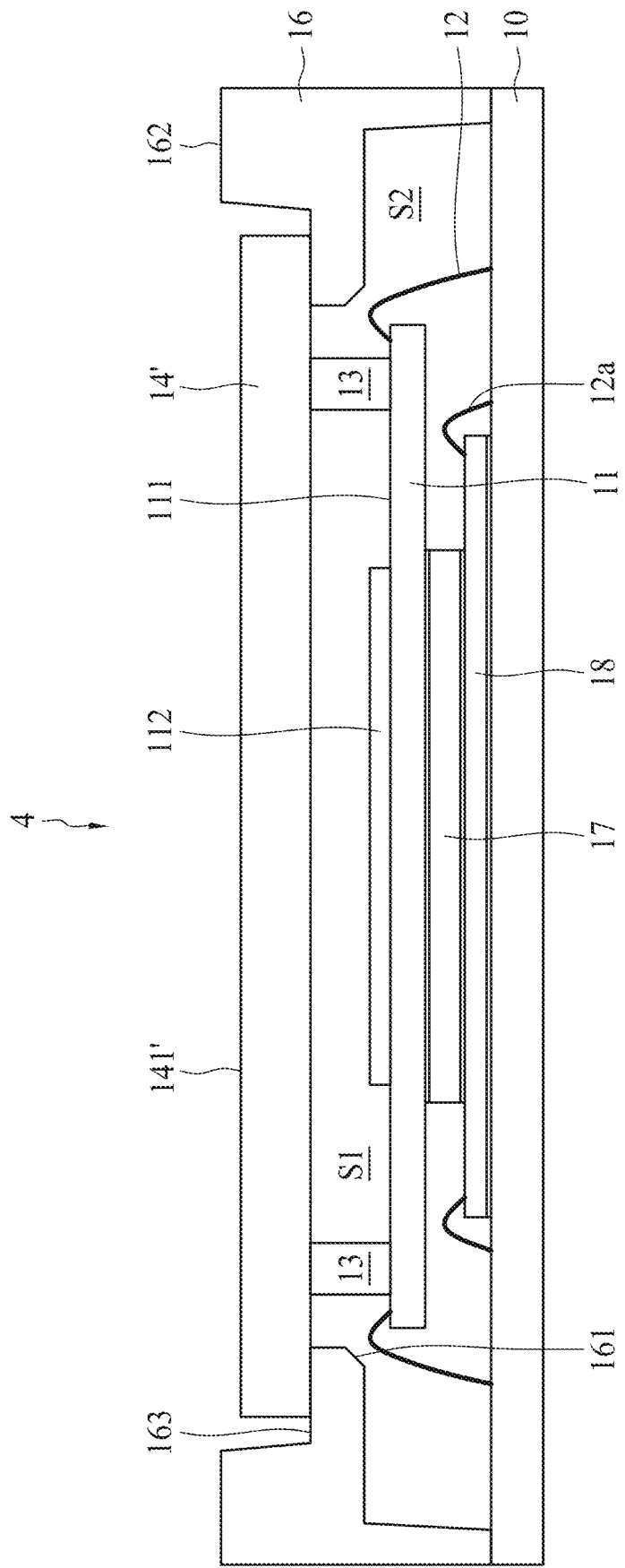
FIG. 4 illustrates a cross-sectional view of a semiconductor package structure in accordance with some other embodiments of the present disclosure.

FIG. 4 illustrates a cross-sectional view of a semiconductor package structure in accordance with some other embodiments of the present disclosure.

Referring to FIG. 4, the semiconductor package structure 4 can include a carrier 10, an electronic device 11 (or semiconductor device 11), conductive wires 12 and 12a, a spacer 13, a transparent panel 14', a lid 16, a spacer 17, and an electronic device 18 (or semiconductor device 18).

Details of the carrier 10, electronic device 11, conductive wires 12, spacer 13 and lid 16 are described above and therefore are not discussed in the paragraphs below.

The electronic device 18 can include, for example but is not limited to, a controller die, an Application Specific Integrated Circuit (ASIC) die or the like. The electronic device 18 can be disposed on the carrier 10. The electronic device 18 can be attached to the carrier 10 by an adhesive layer (not denoted in FIG. 4).

The conductive wire 12a can be same or similar to the conductive wire 12. The conductive wire 12a can be different from the conductive wire 12. The conductive wire 12a electrically connects the electronic device 18 to the carrier 10.

The spacer 17 can be disposed between the electronic device 18 and the electronic device 11. The spacer 17 can be attached to the electronic device 18 by an adhesive layer (not denoted in FIG. 4).

The electronic device 11 can be disposed on the spacer 17. The electronic device 11 can be attached to the spacer 17 by an adhesive layer (not denoted in FIG. 4).

The transparent panel 14' can be similar to the transparent panel 14 as illustrated and described with reference to FIG. 1, except that the transparent panel 14' has a relatively great width.

The transparent panel 14' can be disposed on the lid 16. The transparent panel 14' can be disposed on the surface 163 of the lid 16. The transparent panel 14' can be in direct contact with the lid 16. The transparent panel 14' can be in direct contact with the surface 163 of the lid 16. The transparent panel 14' can be disposed on the spacer 13. The transparent panel 14' can be in direct contact with the spacer 13. The transparent panel 14' can have a substantially great width than the spacer 13.

Although it is not illustrated, however, it is contemplated an adhesive layer, which can be same or similar to the adhesive layer 15 as illustrated and described with reference to FIG. 1, can be disposed between the transparent panel 14' and the lid 16.

Figure 5:
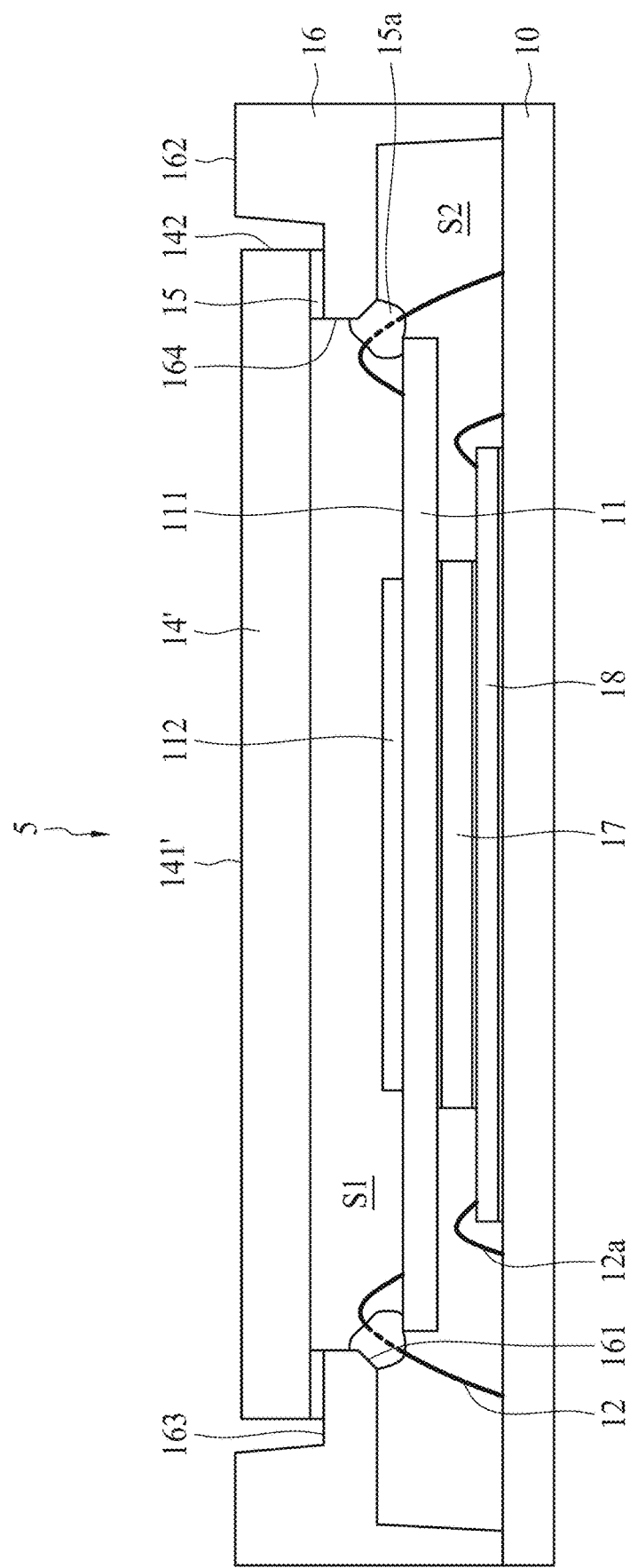
FIG. 5 illustrates a cross-sectional view of a semiconductor package structure in accordance with some other embodiments of the present disclosure.

FIG. 5 illustrates a cross-sectional view of a semiconductor package structure in accordance with some other embodiments of the present disclosure.

Referring to FIG. 5, the semiconductor package structure 5 is similar to the semiconductor package structure 4 as illustrated and described with reference to FIG. 4, except that the semiconductor package structure 5 can further include an adhesive layer 15 and another adhesive layer 15a.

The adhesive layer 15 can be disposed between the transparent panel 14' and the lid 16. The adhesive layer 15 can be disposed between the transparent panel 14' and the surface 163 of the lid 16. The adhesive layer 15 can be in direct contact with the transparent panel 14'. The adhesive layer 15 can be in direct contact with the lid 16. The adhesive layer 15 can be in direct contact with the surface 163 of the lid 16.

The adhesive layer 15a can be disposed on the electronic device 11. The adhesive layer 15a can be disposed on the surface 111 of the electronic device 11. The adhesive layer 15a can be in direct contact with the electronic device 11. The adhesive layer 15a can be in direct contact with the surface 111 of the electronic device 11.

The adhesive layer 15a can surround the optical structure 112. The adhesive layer 15a can enclose the optical structure 112.

The adhesive layer 15a can be in direct contact with the lid 16. The adhesive layer 15a can be in direct contact with the chamfer 161 of the lid 16. The adhesive layer 15a can be in direct contact with the surface 164 of the lid 16.

The adhesive layer 15a can be same or similar to the adhesive layer 15. The adhesive layer 15a can be different from the adhesive layer 15.

The adhesive layer 15a can have an enclosing pattern from a top view perspective. The adhesive layer 15a can have a ring structure from a top view perspective. The adhesive layer 15a can have a ring-like structure from a top view perspective. The adhesive layer 15a can have a circle structure from a top view perspective. The adhesive layer 15a can have a circle-like structure from a top view perspective. The adhesive layer 15a can have a rectangle structure from a top view perspective. The adhesive layer 15a can have a rectangle-like structure from a top view perspective.

Figure 6A:
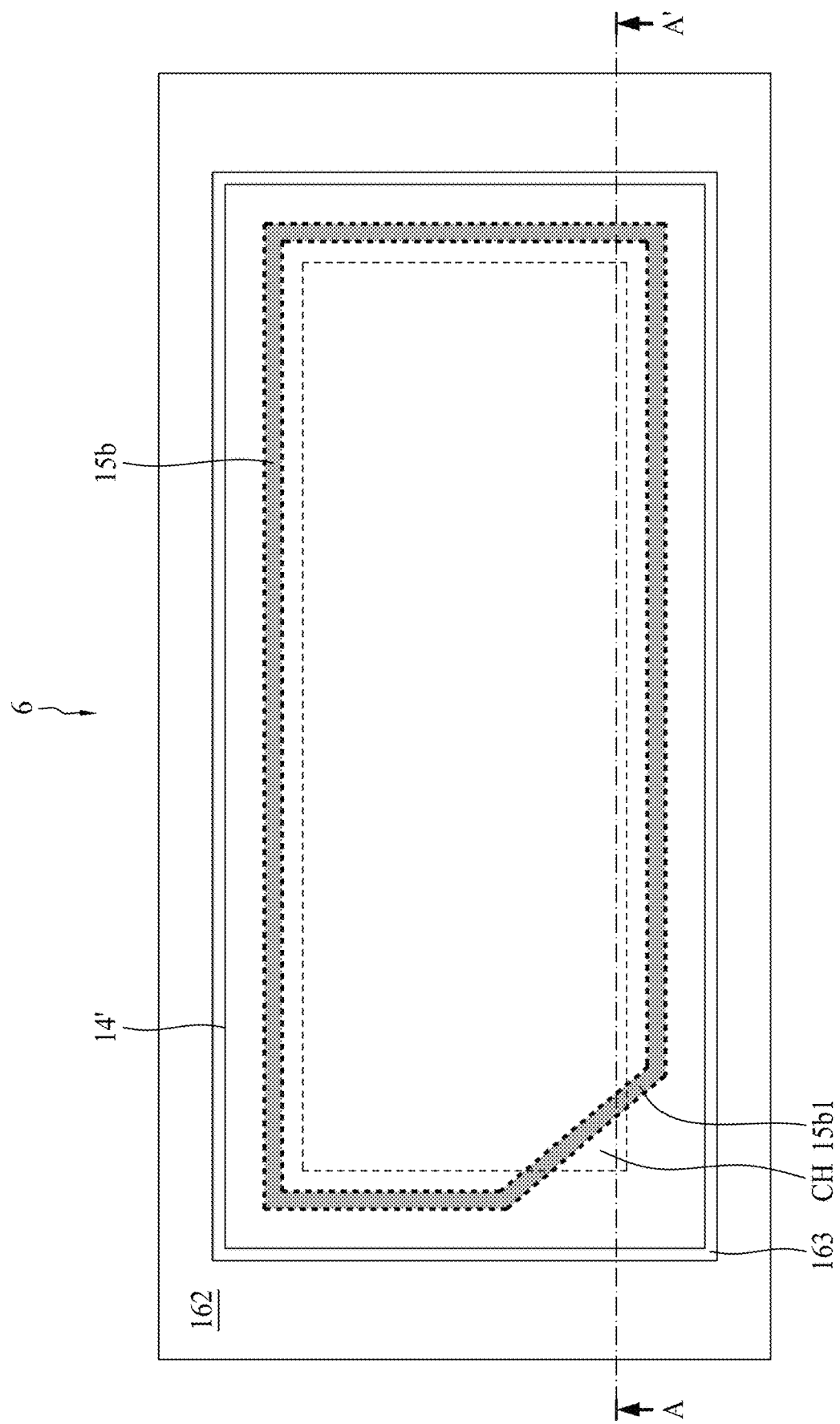
FIG. 6A illustrates a top view of a semiconductor package structure in accordance with some other embodiments of the present disclosure.

FIG. 6A illustrates a top view of a semiconductor package structure in accordance with some other embodiments of the present disclosure.

The semiconductor package structure 6 can have a lid 16 having a surface 162, another surface 163 lower than the surface 162, a transparent panel 14' disposed on the surface 163, and an adhesive layer 15b disposed between the transparent panel 14' and the surface 163.

The adhesive layer 15b can have a chamfer 15b1. The adhesive layer 15b can have an enclosing pattern from a top view perspective. The adhesive layer 15b can have a ring structure from a top view perspective. The adhesive layer 15b can have a ring-like structure from a top view perspective. The adhesive layer 15b can have a circle structure from a top view perspective. The adhesive layer 15b can have a circle-like structure from a top view perspective. The adhesive layer 15b can have a rectangle structure from a top view perspective. The adhesive layer 15b can have a rectangle-like structure from a top view perspective.

The adhesive layer 15b can define an opening CH. The adhesive layer 15b can be disposed across two sides of the surface 163 to define an opening CH. The chamfer 15b1 can define an opening CH.

Figure 6B:
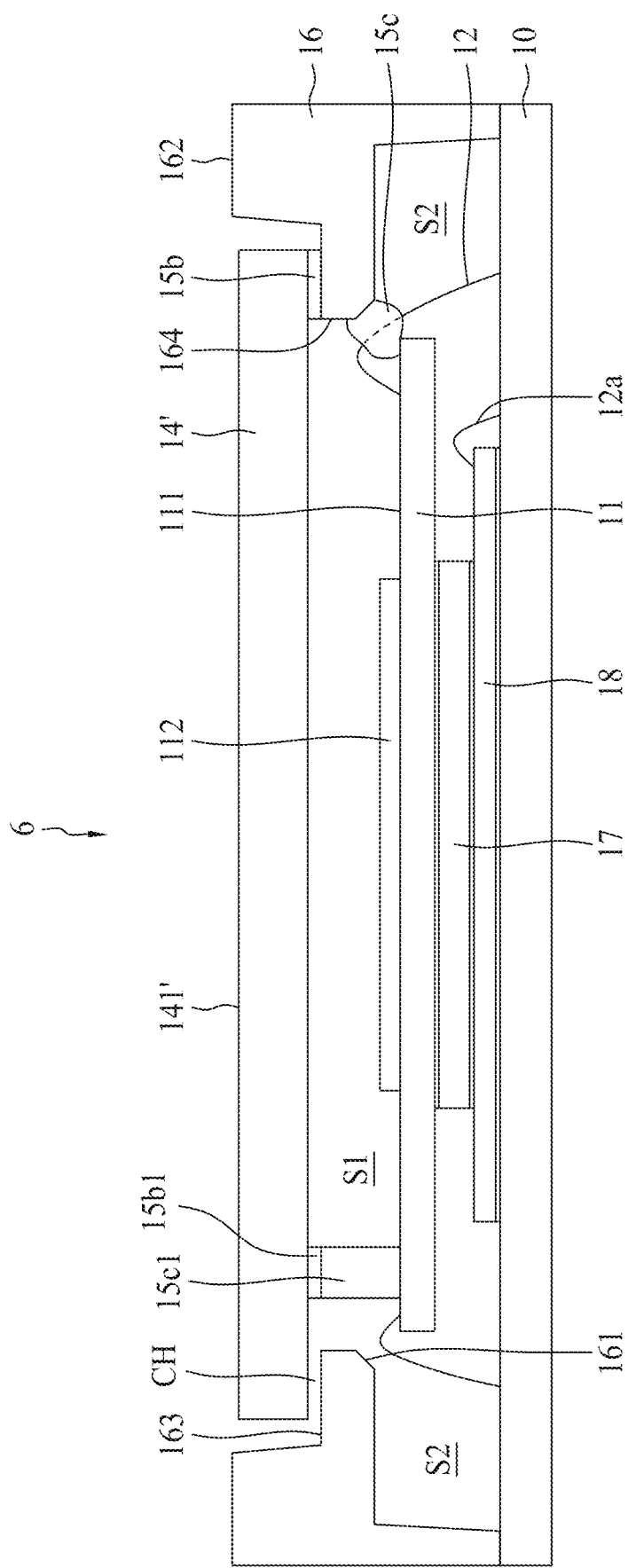
FIG. 6B illustrates a cross-sectional view of the semiconductor package structure across line AA' as shown in FIG. 6A.

FIG. 6B illustrates a cross-sectional view of the semiconductor package structure across line AA' as shown in FIG. 6A.

Referring to FIG. 6B, the semiconductor package structure 6 is similar to the semiconductor package structure 5 as illustrated and described with reference to FIG. 5, except that the adhesive layer 15 and the adhesive layer 15a of the semiconductor package structure 5 are respectively replaced by the adhesive layer 15b and the adhesive layer 15c to form the semiconductor package structure 6.

The adhesive layer 15c can have a structure same or similar to the adhesive layer 15b. The adhesive layer 15c can have a structure different from the adhesive layer 15b. The adhesive layer 15c can have a chamfer 15c1. The adhesive layer 15c can have a substantially same pattern to the adhesive layer 15b from a top view perspective. The adhesive layer 15c can have a substantially similar pattern to the adhesive layer 15b from a top view perspective.

The adhesive layer 15c can be in direct contact with the adhesive layer 15b. The chamfer 15c1 of the adhesive layer 15c can be in direct contact with the chamfer 15b1 of the adhesive layer 15b.

The adhesive layer 15c can be in direct contact with the lid 16. The adhesive layer 15c can be in direct contact with the chamfer 161 of the lid 16. The adhesive layer 15c can be in direct contact with the surface 164 of the lid 16.

The adhesive layer 15b can be disposed between the transparent panel 14' and the lid 16. The adhesive layer 15b can be disposed between the transparent panel 14' and the surface 163 of the lid 16. The adhesive layer 15b can be in direct contact with the transparent panel 14'. The adhesive layer 15b can be in direct contact with the lid 16. The adhesive layer 15b can be in direct contact with the surface 163 of the lid 16.

The semiconductor package structure 6 defines a room or space S1. The space S1 can be defined or enclosed by the electronic device 11, the transparent panel 14', the lid 16, the adhesive layer 15b and the adhesive layer 15c. The semiconductor package structure 6 defines another room or space S2.

When manufacturing a final product that includes the semiconductor package structure 6, various techniques can involve, for example but is not limited to, cutting technique, cleaning technique (e.g. by air gun), heating technique, etc. The particle(s) resulted from the cutting operation can be pushed to pass the opening CH (as shown in FIG. 6B) to enter the space S2. However, the particle(s) cannot enter the hermetically sealed space S1. Accordingly, the optical structure 112 in the sealed space S1 is protected. In other words, performance of the semiconductor package structure 6 is not affected even the external particle(s) is forced into the space S2.

Moreover, the air in space S1, which can have a relatively less volume, does not have sufficient force or power to break the sealed structure, even the air expands during the heat operation. For example, the relatively less air in the space S1 may still have not enough pressure to break the bond between the transparent panel 14' and the adhesive layer 15b, or to break the bond between the electronic device 11 and the adhesive layer 15c, or to break the bond between the adhesive layer 15b and the adhesive layer 15c, or to break the bond between the lid 16 and the adhesive layer 15c, or to break the bond between the lid 16 and the adhesive layer 15b. In other words, the sealed structure can mitigate popcorn effect.

The opening CH can give vent to the air in the space S2 even during the heat operation. Accordingly, the bond between the lid 16 and the carrier 10 can sustain during the heat operation. In other words, the opening CH can mitigate popcorn effect.

The semiconductor package structure 6 can be integrated into, for example but is not limited to, a lidar system for vehicles, which may undergo extreme condition or environment (e.g. temperature up to 60° Celsius (° C.) or down to −20° C.).

Figure 7:
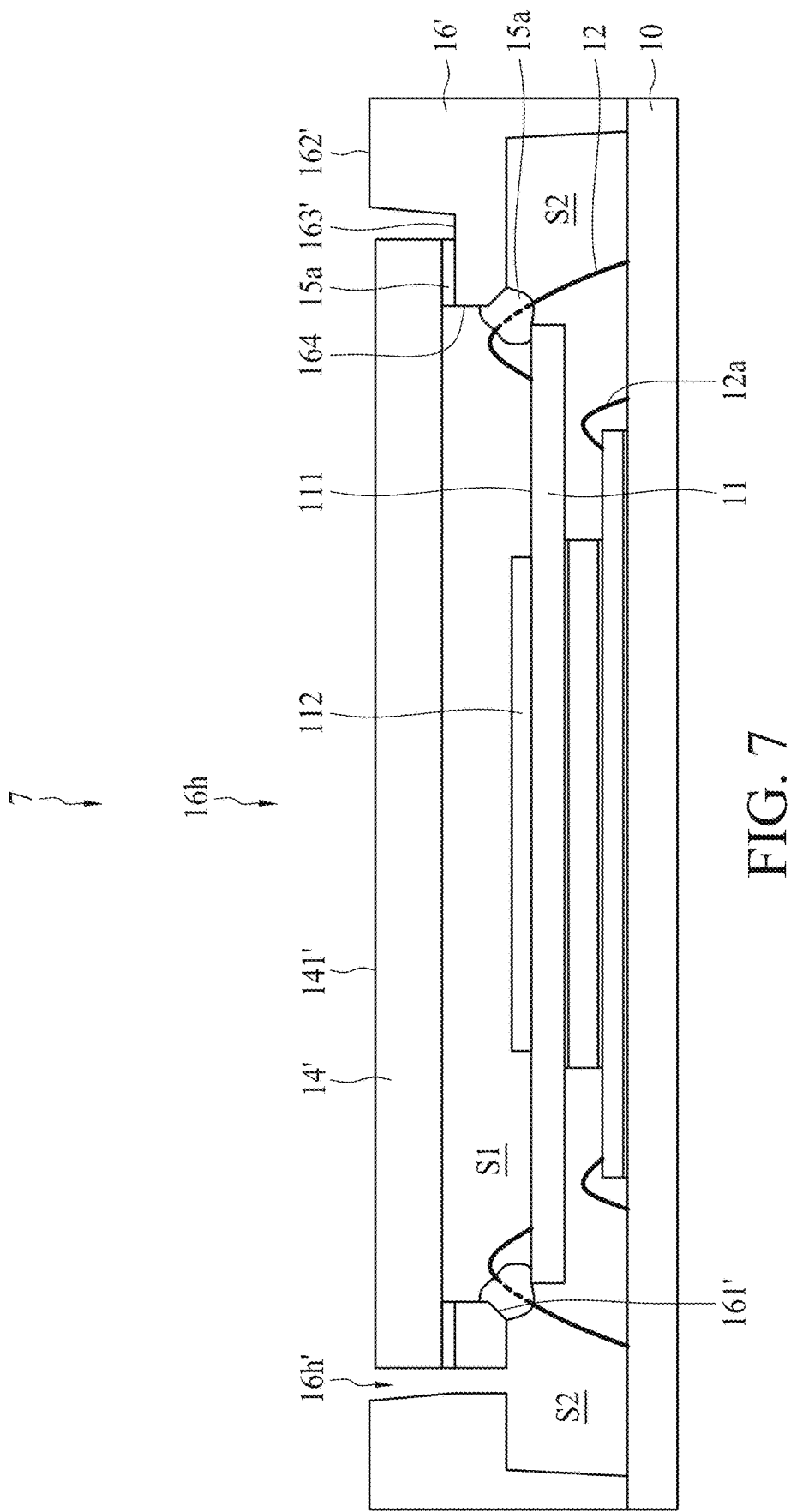
FIG. 7 illustrates a cross-sectional view of a semiconductor package structure in accordance with some other embodiments of the present disclosure.

FIG. 7 illustrates a cross-sectional view of a semiconductor package structure in accordance with some other embodiments of the present disclosure.

Referring to FIG. 7, the semiconductor package structure 7 is similar to the semiconductor package structure 5 as illustrated and described with reference to FIG. 5, except that the adhesive layer 15 and the lid 16 of the semiconductor package structure 5 are respectively replaced by the adhesive layer 15a and the lid 16' to form the semiconductor package structure 7.

The adhesive layer 15a can have an enclosing pattern from a top view perspective. The adhesive layer 15a can have a ring structure from a top view perspective. The adhesive layer 15a can have a ring-like structure from a top view perspective. The adhesive layer 15a can have a circle structure from a top view perspective. The adhesive layer 15a can have a circle-like structure from a top view perspective. The adhesive layer 15a can have a rectangle structure from a top view perspective. The adhesive layer 15a can have a rectangle-like structure from a top view perspective.

The lid 16' can define an opening 16h on the electronic device 11. The lid 16' can define an opening 16h on the transparent panel 14'. The lid 16' can define an opening 16h to expose the transparent panel 14'. The lid 16' can define another opening 16h' different from the opening 16h. The opening 16h' can include a through hole.

When manufacturing a final product that includes the semiconductor package structure 7, various techniques can involve, for example but is not limited to, cutting technique, cleaning technique (e.g. by air gun), heating technique, etc. The particle(s) resulted from the cutting operation can be pushed to pass the opening 16h' to enter the space S2. However, the particle(s) cannot enter the hermetically sealed space S1. Accordingly, the optical structure 112 in the sealed space S1 is protected. In other words, performance of the semiconductor package structure 6 is not affected even the external particle(s) is forced into the space S2.

Moreover, the air in space S1, which can have a relatively less volume, does not have sufficient force or power to break the sealed structure, even the air expands during the heat operation. For example, the relatively less air in the space S1 may still have not enough pressure to break the bond between the transparent panel 14' and the adhesive layer 15a, or to break the bond between the electronic device 11 and the adhesive layer 15a, or to break the bond between the adhesive layer 15a and the adhesive layer 15a, or to break the bond between the lid 16 and the adhesive layer 15a. In other words, the sealed structure can mitigate popcorn effect.

The opening 16h' can give vent to the air in the space S2 even during the heat operation. Accordingly, the bond between the lid 16' and the carrier 10 can sustain during the heat operation. In other words, the opening CH can mitigate popcorn effect.

The semiconductor package structure 7 can be integrated into, for example but is not limited to, a lidar system for vehicles, which may undergo extreme condition or environment (e.g. temperature up to 60° Celsius (° C.) or down to −20° C.).

Figure 8:
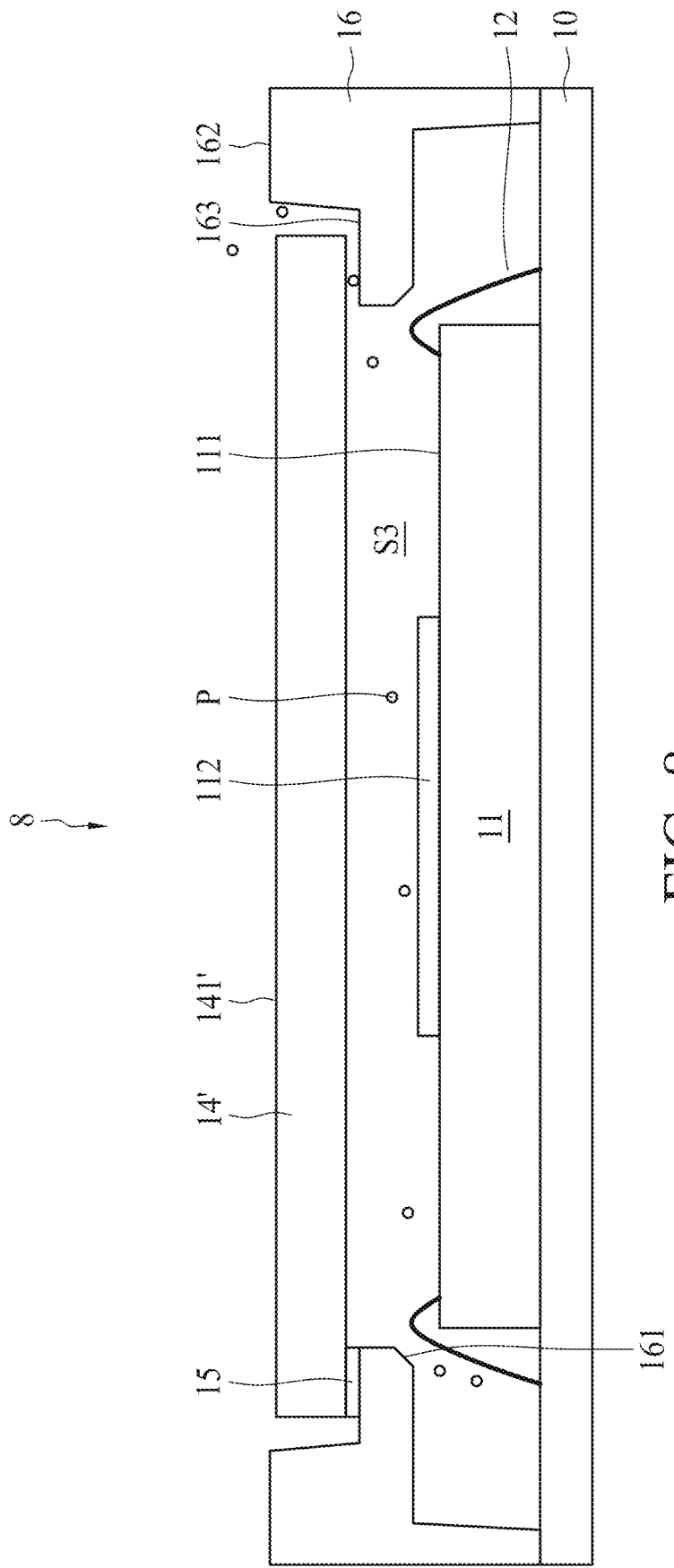
FIG. 8 illustrates a cross-sectional view of a semiconductor package structure in accordance with some other embodiments of the present disclosure.

FIG. 8 illustrates a cross-sectional view of a semiconductor package structure in accordance with some other embodiments of the present disclosure.

Referring to FIG. 8, the semiconductor package structure 8 can include a carrier 10, an electronic device 11, conductive wires 12, a transparent panel 14', an adhesive layer 15, and a lid 16.

The adhesive layer 15 disposed between the transparent panel 14' and the lid 16 can define an opening 15h as shown in FIG. 1C.

When manufacturing a final product that includes the semiconductor package structure 8, various techniques can involve, for example but is not limited to, cutting technique, cleaning technique (e.g. by air gun), heating technique, etc. Particle(s) P resulted from the cutting operation can be pushed (e.g. by relatively great air pressure) to pass the opening 15h to enter the space S3, which adversely affect performance of the semiconductor package structure 8.

Figure 9:
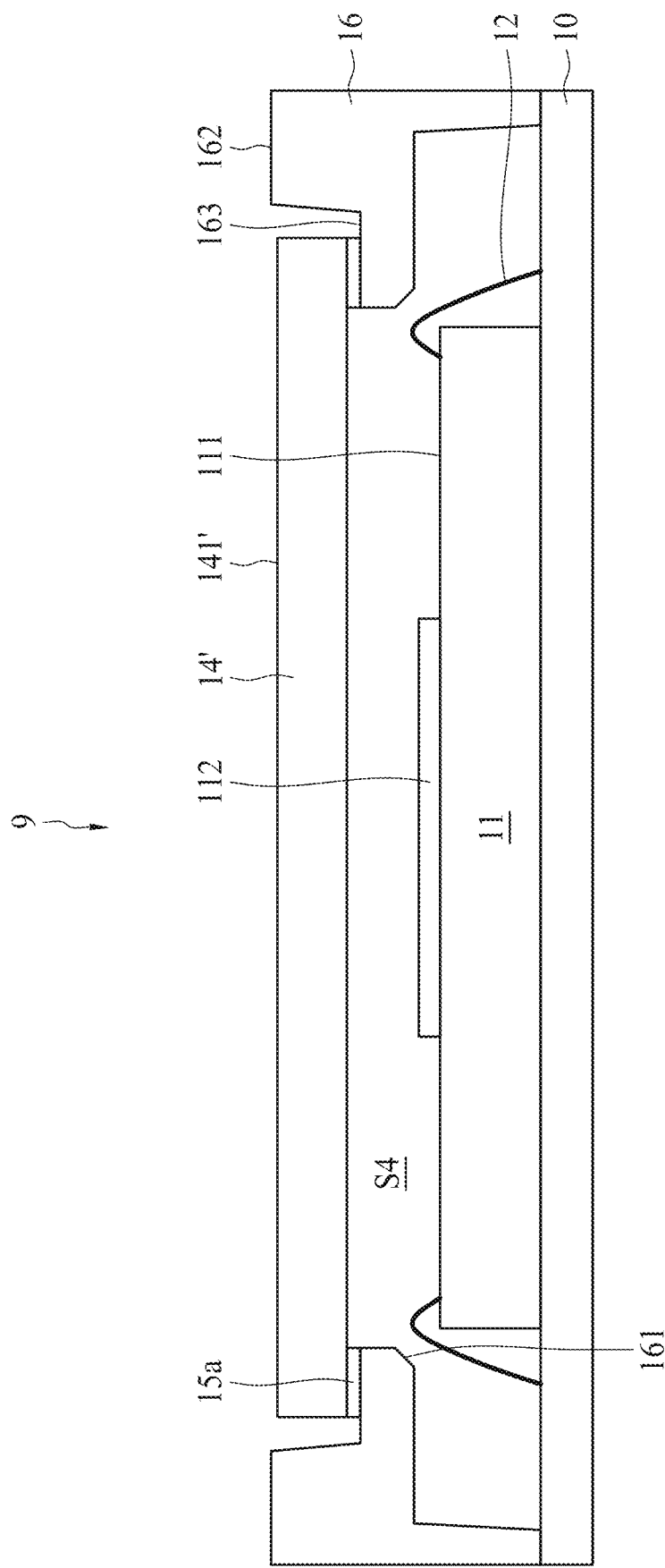
FIG. 9 illustrates a cross-sectional view of a semiconductor package structure in accordance with some other embodiments of the present disclosure.

FIG. 9 illustrates a cross-sectional view of a semiconductor package structure in accordance with some other embodiments of the present disclosure.

Referring to FIG. 9, the semiconductor package structure 9 is similar to the semiconductor package structure 8 as illustrated and described with reference to FIG. 8, except that the adhesive layer 15 the semiconductor package structure 8 is replaced by the adhesive layer 15a to form the semiconductor package structure 9.

The adhesive layer 15a has an enclosing pattern or structure from a top view perspective. The adhesive layer 15a can seal the space S4 to prevent or stop the particle(s) from entering the space S4.

When manufacturing a final product that includes the semiconductor package structure 9, various techniques can involve, for example but is not limited to, cutting technique, cleaning technique (e.g. by air gun), heating technique, etc. The particle(s) resulted from the cutting operation cannot enter the space S4. However, the air in space S4, which can have a relatively great volume, can have sufficient force or power to break the sealed structure when the air expands during the heat operation. For example, the relatively great air in the space S4 may have enough pressure to break the bond between the transparent panel 14' and the adhesive layer 15a, or to break the bond between the lid 16 and the adhesive layer 15a, or to break the bond between the lid 16 and the carrier 10. In other words, the semiconductor package structure 9 may not survive popcorn effect.

Figure 10:
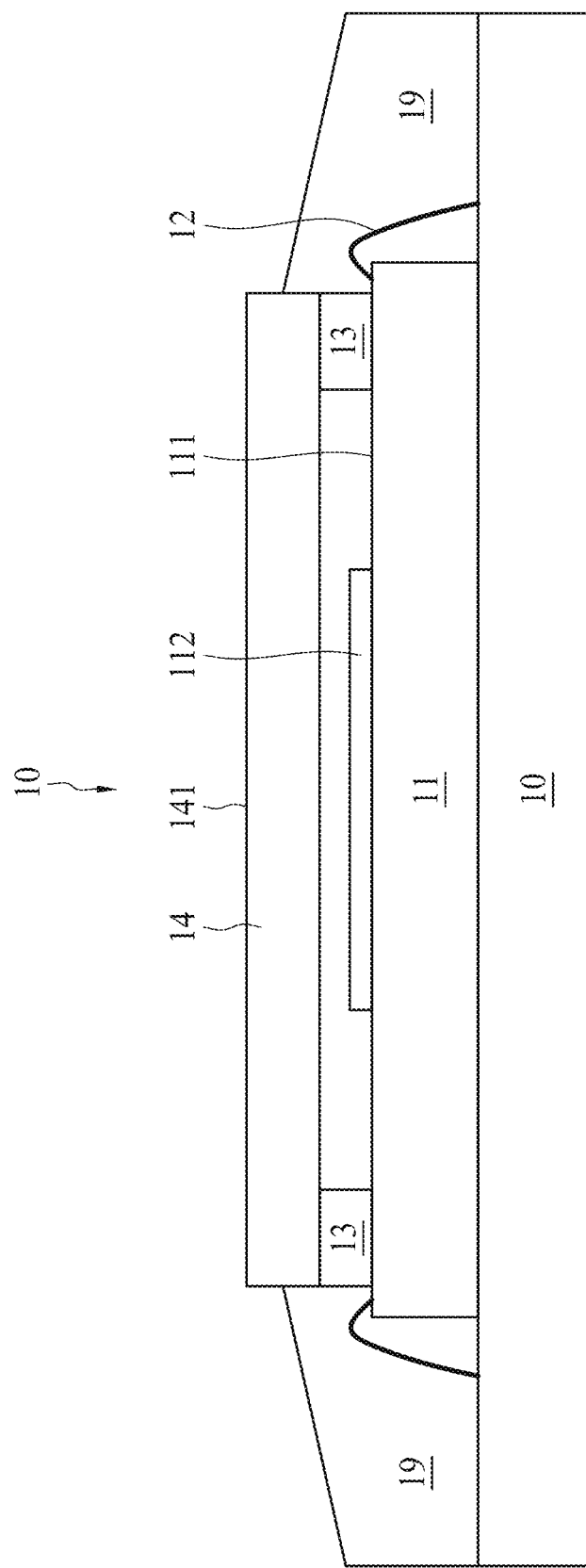
FIG. 10 illustrates a cross-sectional view of a semiconductor package structure in accordance with some other embodiments of the present disclosure.

FIG. 10 illustrates a cross-sectional view of a semiconductor package structure in accordance with some other embodiments of the present disclosure.

Referring to FIG. 10, the semiconductor package structure 10 can include a carrier 10, an electronic device 11, conductive wires 12, a spacer 13, a transparent panel 14, and an encapsulant 19.

The semiconductor package structure 10 can be integrated into, for example but is not limited to, a lidar system for vehicles, which may undergo extreme condition or environment (e.g. temperature up to 60° Celsius (° C.) or down to −20° C.).

The encapsulant 19 encapsulates the conductive wires 12. The encapsulant 19 encapsulates the spacer 13. The encapsulant 19 encapsulates an outer, lateral surface of the spacer 13. The encapsulant 19 encapsulates the transparent panel 14. The encapsulant 19 encapsulates a side or lateral surface of the transparent panel 14. The encapsulant 19 encapsulates a lower portion of a side or lateral surface of the transparent panel 14.

The encapsulant 19 can include epoxy. The encapsulant 19 can include fillers or particles. The encapsulant 19 can have a relatively great coefficient of thermal expansion (CTE) than the transparent panel 14. The spacer 13 can have a relatively great CTE than the transparent panel 14. When undergoing extreme condition change or thermal cycles, mismatch of CTE can cause warpage, which can break the transparent panel 14. The CTE mismatch can also cause delamination issues at interface or boundary between the encapsulant 19 and the transparent panel 14, between the encapsulant 19 and the spacer 13, between the transparent panel 14 and the spacer 13, or between the electronic device 11 and the spacer 13.

The conductive wire 12 can be broke or damaged by mold flow during operation of encapsulation. Bond between the conductive wire 12 and the carrier 10 can be broke or damaged by mold flow during operation of encapsulation. Bond between the conductive wire 12 and the electronic device 11 can be broke or damaged by mold flow during operation of encapsulation.

The conductive wire 12, which is encapsulated by the encapsulant 19, may suffer stress caused by environmental change(s). For example, the stress resulted from CTS mismatch may cause warpage of the encapsulant 19 and damage on the conductive wire 12. For example, the moisture or relatively great humidity may cause expansion of the spacer 13, which can have a relatively great water absorption, may result in stress to the encapsulant 19 and to the conductive wire 12, and the stress may damage the conductive wire 12.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
a carrier;
a lid disposed on the carrier;
a transparent panel disposed over the carrier, wherein the lid and the transparent panel are separated by a horizontal gap; and
an adhesive layer covering the horizontal gap,
wherein at least a portion of the horizontal gap is exposed from the adhesive layer such that a vent hole is formed, and wherein at least a portion of the adhesive layer is on an upper surface of the transparent panel and is on an upper surface of the lid.

2. The semiconductor package structure of claim 1, wherein the upper surface of the lid is lower in elevation than a top surface of the lid.

3. The semiconductor package structure of claim 1, wherein the vent hole is located at a corner of the adhesive layer.

4. The semiconductor package structure of claim 3, wherein a bottom surface of the adhesive layer is lower than an upper surface of the lid.

5. The semiconductor package structure of claim 1, wherein the lid, the transparent panel, the carrier, and the adhesive layer collectively define a cavity, wherein the cavity is in communication with ambient atmosphere through the vent hole.

6. The semiconductor package structure of claim 1, further comprising an electronic device disposed on the carrier, wherein a vertical projection of the transparent panel is free from overlapping a vertical projection of the lid, and wherein a vertical projection of the lid is free from overlapping a vertical projection of the electronic device.

7. A semiconductor package structure, comprising:
a carrier:
a lid disposed on the carrier;
a transparent panel disposed over the carrier, wherein the lid and the transparent panel are separated by a horizontal gap; and
an adhesive layer covering the horizontal gap,
wherein at least a portion of the horizontal gap is exposed from the adhesive layer such that a vent hole is formed, and wherein the adhesive layer covers an upper surface of the transparent panel, and wherein the adhesive layer is in direct contact with a lateral surface of the transparent panel.

8. A semiconductor package structure, comprising:
a carrier;
a lid disposed on the carrier;
an electronic device disposed on the carrier; and
a transparent panel disposed over the electronic device, wherein the transparent panel is connected to the lid by an adhesive layer, and the transparent panel is connected to the electronic device by a spacer, wherein the spacer comprises different layers, wherein the layers include a first layer, a second layer on the first layer and a third layer on the second layer, the first layer and the second layer include metal, and the third layer includes a solder.

9. The semiconductor package structure of claim 8, wherein a vertical projection of an inner surface of an upper portion of the lid is located between a vertical projection of an inner surface of an intermediate portion of the lid and a vertical projection of an inner surface of the lower portion of the lid.

10. The semiconductor package structure of claim 8, wherein a vertical projection of a lateral surface of the electronic device is located between a vertical projection of a lateral surface of the transparent panel and a vertical projection of an inner surface of an intermediate portion of the lid.

11. The semiconductor package structure of claim 8, wherein the adhesive layer and the spacer are disposed on different side surfaces of the transparent panel.

12. The semiconductor package structure of claim 8, wherein a vertical projection of an inner surface of an upper portion of the lid is located between a vertical projection of an inner surface of an intermediate portion of the lid and a vertical projection of an inner surface of the lower portion of the lid, wherein a vertical projection of a lateral surface of the electronic device is located between a vertical projection of a lateral surface of the transparent panel and a vertical projection of an inner surface of an intermediate portion of the lid, and wherein the adhesive layer and the spacer are disposed on different side surfaces of the transparent panel.

13. A semiconductor package structure, comprising:
a carrier;
a lid disposed on the carrier;
a transparent panel disposed over the carrier, wherein the lid and the transparent panel are separated by a horizontal gap; and
an adhesive layer covering the horizontal gap,
wherein at least a portion of the horizontal gap is exposed from the adhesive layer such that a vent hole is formed, wherein the adhesive layer covers an upper surface of the transparent panel, and wherein the adhesive layer is in direct contact with a lateral surface of the transparent panel, wherein at least a portion of the adhesive layer is on an upper surface of the transparent panel and is on an upper surface of the lid, wherein the vent hole is located at a corner of the adhesive layer, wherein the lid, the transparent panel, the carrier, and the adhesive layer collectively define a cavity, wherein the cavity is in communication with ambient atmosphere through the vent hole, and wherein a vertical projection of the transparent panel is free from overlapping a vertical projection of the lid in a vertical direction, and wherein a vertical projection of the lid is free from overlapping a vertical projection of the electronic device.

* * * * *